(12) United States Patent
Sakai et al.

(10) Patent No.: US 9,236,507 B2
(45) Date of Patent: Jan. 12, 2016

(54) PHOTOELECTRIC CONVERSION ELEMENT AND METHOD FOR MANUFACTURING SAME

(71) Applicant: Sharp Kabushiki Kaisha, Osaka-shi, Osaka (JP)

(72) Inventors: Toshihiko Sakai, Osaka (JP); Kenji Kimoto, Osaka (JP); Naoki Koide, Osaka (JP); Yoshitaka Yamamoto, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/429,433

(22) PCT Filed: Sep. 19, 2013

(86) PCT No.: PCT/JP2013/075268
§ 371 (c)(1),
(2) Date: Mar. 19, 2015

(87) PCT Pub. No.: WO2014/050687
PCT Pub. Date: Apr. 3, 2014

(65) Prior Publication Data
US 2015/0249169 A1 Sep. 3, 2015

(30) Foreign Application Priority Data
Sep. 26, 2012 (JP) ................................. 2012-212547

(51) Int. Cl.
*H01L 31/0224* (2006.01)
*H01L 31/0747* (2012.01)
(Continued)

(52) U.S. Cl.
CPC .... *H01L 31/022466* (2013.01); *H01L 31/0376* (2013.01); *H01L 31/0747* (2013.01); *H01L 31/1884* (2013.01); *Y02E 10/547* (2013.01)

(58) Field of Classification Search
CPC ................... H01L 31/022466; H01L 31/0747; H01L 31/0376; H01L 31/1884
USPC ............................ 136/256, 255, 252; 438/96
See application file for complete search history.

(56) References Cited

U.S. PATENT DOCUMENTS 8,796,539 B2 * 8/2014 Asaumi ........... H01L 31/022441
136/256
8,802,972 B2 * 8/2014 Oh .................. H01L 31/022425
136/256

(Continued)

FOREIGN PATENT DOCUMENTS

JP 2005-101151 A 4/2005

*Primary Examiner* — Golam Mowla
(74) *Attorney, Agent, or Firm* — Keating & Bennett, LLP

(57) ABSTRACT

The photoelectric conversion element includes a semiconductor substrate, a first amorphous film of a first conductivity type disposed on an entire surface of one surface of the semiconductor substrate, a first conductive oxide layer disposed on the first amorphous film, a second amorphous film of the first conductivity type disposed on a part of the other surface of the semiconductor substrate, a second conductive oxide layer disposed on the second amorphous film, a third amorphous film of a second conductivity type disposed on the other part of the other surface of the semiconductor substrate, and a third conductive oxide layer disposed on the third amorphous film. Electric conductivity of the first conductive oxide layer is lower than electric conductivities of the second and the third conductive oxide layer. Transmittance of the first conductive oxide layer is higher than transmittances of the second and the third conductive oxide layer.

4 Claims, 5 Drawing Sheets

(51) Int. Cl.
*H01L 31/18* (2006.01)
*H01L 31/0376* (2006.01)

(56) References Cited

U.S. PATENT DOCUMENTS

| | | | | |
|---|---|---|---|---|
| 8,859,324 B2* | 10/2014 | Stewart | ................ | H01L 31/068 136/256 |
| 2005/0062041 A1 | 3/2005 | Terakawa et al. | | |
| 2006/0130891 A1* | 6/2006 | Carlson | ............ | H01L 31/02168 136/256 |
| 2008/0173347 A1* | 7/2008 | Korevaar | ............... | H01L 31/036 136/255 |
| 2010/0193027 A1* | 8/2010 | Ji | ...................... | H01L 31/02168 136/256 |
| 2011/0056544 A1* | 3/2011 | Ji | ......................... | H01L 31/028 136/255 |
| 2012/0042945 A1* | 2/2012 | Ji | ....................... | H01L 31/0682 136/256 |
| 2012/0145233 A1* | 6/2012 | Syn | .................. | H01L 31/02167 136/256 |

\* cited by examiner

PHOTOELECTRIC CONVERSION ELEMENT AND METHOD FOR MANUFACTURING SAME

TECHNICAL FIELD

The present invention relates to a photoelectric conversion element and a method for manufacturing the same.

BACKGROUND ART

Recently, expectations for a solar cell capable of directly converting solar energy into electric energy have increased rapidly as an energy source of the next generation, in particular, from a viewpoint of global environmental problems. As the solar cell, various solar cells such as a solar cell using a compound semiconductor or an organic material are included, and currently, a solar cell using silicon crystal is mainly being used.

Then, currently, a solar cell which has been manufactured and sold most commonly is a solar cell having a structure where electrodes are respectively formed on a light receiving surface on a side on which solar light is incident and on a back surface on an opposite side of the light receiving surface. However, when the electrode is formed on the light receiving surface, the amount of solar light to be incident is decreased by the area of the electrode due to reflection and absorption of the solar light in the electrode.

Therefore, for example, as disclosed in Japanese Unexamined Patent Application Publication No. 2005-101151 (PTL 1), a solar cell (a hetero-junction back contact cell) in which an i-type amorphous silicon film is formed on a back surface of an n-type single crystal silicon substrate, an n-type amorphous silicon film and a p-type amorphous silicon film are formed thereon, and an electrode is formed thereon has been developed.

CITATION LIST

Patent Literature

PTL 1: Japanese Unexamined Patent Application Publication No. 2005-101151

SUMMARY OF INVENTION

Technical Problem

In the solar cell disclosed in PTL 1, a laminated structure of an i-type amorphous film and an antireflective film is formed on a light receiving surface of a semiconductor substrate, and a laminated structure of an i-type amorphous film, a p-type amorphous film, an n-type amorphous film, and an electrode layer and a laminated structure of an i-type amorphous film, an n-type amorphous film, and an electrode layer are formed on a surface (hereinafter, referred to as a "back surface") on a side opposite to the light receiving surface. That is, the light receiving surface and the back surface have considerably different configurations of the laminated structure, and thus surface stress on the light receiving surface side of the semiconductor substrate and surface stress on the back surface of the semiconductor substrate are different from each other, an adverse effect due to curving of the semiconductor substrate or the like is concerned in a manufacturing process, and it is difficult to make the solar cell thin.

On the other hand, according to the spread of the solar cell, importance in the manufacturing cost gradually increases, and a development of a solar cell which is able to be manufactured at a lower cost is expected. In addition, a further improvement in conversion efficiency is simultaneously required.

The present invention is made in consideration of the circumstances described above, and is to provide a photoelectric conversion element which has high conversion efficiency, and is able to be thinned and is able to be manufacture at a low cost.

Solution to Problem

The present inventors have conducted intensive studies in order to solve the problems described above, and thus have found that it is possible to prevent the curving of the semiconductor substrate and to improve conversion efficiency of the photoelectric conversion element by making the laminated structures approximate to each other on the light receiving surface and on the back surface of the semiconductor substrate and by having a specific relationship between electric conductivity and transmittance of an antireflective film and an electrode layer, and the present invention has been completed according to intensive studies based on the findings.

That is, a photoelectric conversion element of the present invention includes a semiconductor substrate of a first conductivity type, a first amorphous film of a first conductivity type disposed on an entire surface of one surface of the semiconductor substrate, a first conductive oxide layer disposed on the first amorphous film, a second amorphous film of the first conductivity type disposed on a part of the other surface of the semiconductor substrate, a second conductive oxide layer disposed on the second amorphous film, a second conductive third amorphous film of a second conductivity type disposed on the other part of the other surface of the semiconductor substrate, and a third conductive oxide layer disposed on the third amorphous film, in which electric conductivity of the first conductive oxide layer is lower than electric conductivities of the second conductive oxide layer and the third conductive oxide layer, and transmittance of the first conductive oxide layer is higher than transmittances of the second conductive oxide layer and the third conductive oxide layer.

Here, it is preferable that the first conductive oxide layer, the second conductive oxide layer, and the third conductive oxide layer are oxides configured of a common element, and it is preferable that oxygen contents of the second conductive oxide layer and the third conductive oxide layer are lower than an oxygen content of the first conductive oxide layer.

Furthermore, here, "first conductivity type" indicates "p-type" or "n-type", and "second conductivity type" indicates "n-type" or "p-type" different from the first conductivity type.

In addition, it is preferable that the common element is at least one element selected from a group consisting of indium, tin, gallium, zinc, and aluminum, and more specifically, it is preferable that the oxide is at least one component selected from a group consisting of indium tin oxide, indium zinc oxide, indium gallium zinc oxide, and aluminum zinc oxide.

In addition, it is preferable that the oxygen content of the first conductive oxide layer is greater than or equal to 33 at % and less than or equal to 50 at %, and it is preferable that the oxygen content of the second conductive oxide layer and the third conductive oxide layer is less than 33 at %. Furthermore, "at %" indicates an "atomic percentage", that is, a concentration of the number of atoms.

In addition, the present invention also relates to a method for manufacturing the photoelectric conversion element described above, and the manufacturing method includes a step of forming a first amorphous film of a first conductivity type on an entire surface of one surface of a semiconductor substrate of the first conductivity type, a step of forming a first conductive oxide layer on the first amorphous film by a sputtering method, a step of forming a second amorphous film of the first conductivity type on the other surface of the semiconductor substrate, a step of forming a third amorphous film of a second conductivity type on the other surface to be separated from the second amorphous film, a step of forming a mask material between the second amorphous film and the third amorphous film, a step of forming a conductive oxide layer for preparing a second conductive oxide layer and a third conductive oxide layer by a sputtering method on the second amorphous film, on the third amorphous film, and on the mask material, and a step of separating the conductive oxide layer for preparing the second conductive oxide layer and the third conductive oxide layer into the second conductive oxide layer and the third conductive oxide layer by removing the mask material, and in which an introduced oxygen flow ratio in the step of forming the first conductive oxide layer by the sputtering method is higher than an introduced oxygen flow ratio in the step of forming the conductive oxide layer for preparing the second conductive oxide layer and the third conductive oxide layer by the sputtering method.

Furthermore, here, the introduced oxygen flow ratio indicates a ratio of an introduced oxygen flow rate to a total introduced gas flow rate including inert gas such as argon gas.

In addition, it is preferable that the introduced oxygen flow ratio in the step of forming the first conductive oxide layer by the sputtering method is greater than or equal to 5% and less than or equal to 50%, and it is preferable that the introduced oxygen flow ratio in the step of forming the conductive oxide layer for preparing the second conductive oxide layer and the third conductive oxide layer by the sputtering method is less than 5%.

Advantageous Effects of Invention

The photoelectric conversion element of the present invention has an excellent effect in which the photoelectric conversion element has high conversion efficiency, and is able to be thinned and is able to be manufacture at a low cost.

DESCRIPTION OF EMBODIMENTS

Figure 1:
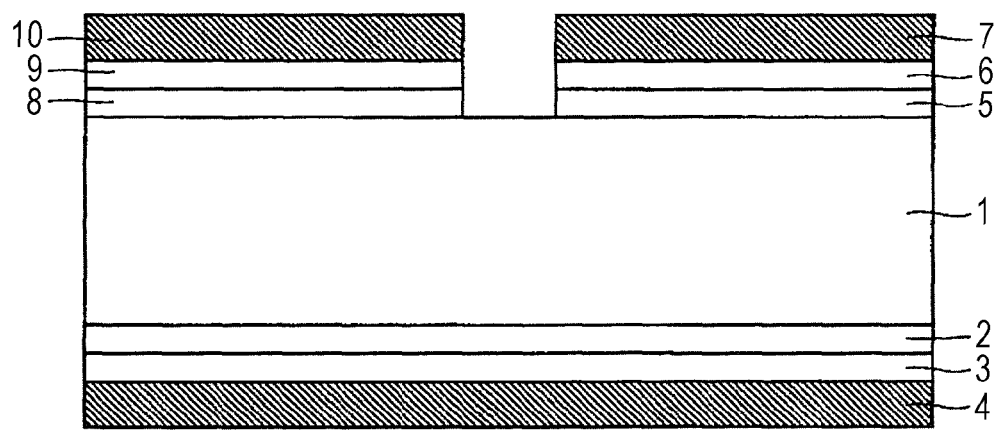
FIG. 1 is a schematic cross-sectional view of a photoelectric conversion element of an embodiment.

Hereinafter, an embodiment of the present invention will be described in more detail. Furthermore, in the drawings of the present invention, the same reference numerals indicate the same parts or the corresponding parts.

<Photoelectric Conversion Element>
(Overall Configuration)

FIG. 1 is a schematic cross-sectional view of a photoelectric conversion element of an embodiment. In the photoelectric conversion element which is the embodiment of the present invention, a first non-doped film 2 formed of i-type amorphous silicon, a first amorphous film 3 formed of n-type amorphous silicon, and a first conductive oxide layer 4 are laminated on a light receiving surface of a semiconductor substrate 1, a second non-doped film 5 formed of i-type amorphous silicon, a second amorphous film 6 formed of n-type amorphous silicon, and a second conductive oxide layer 7 are laminated on a back surface of the semiconductor substrate 1, and a third non-doped film 8 formed of i-type amorphous silicon, a third amorphous film 9 formed of p-type amorphous silicon, and a third conductive oxide layer 10 are laminated on the other back surface of the semiconductor substrate 1. Here, a metal electrode layer formed of aluminum, silver, or the like may be further formed on back surfaces of the second conductive oxide layer 7 and the third conductive oxide layer 10.

Then, electric conductivity of the first conductive oxide layer 4 is lower than electric conductivities of the second conductive oxide layer 7 and the third conductive oxide layer 10, and transmittance of the first conductive oxide layer 4 is higher than transmittances of the second conductive oxide layer 7 and the third conductive oxide layer 10.

In the photoelectric conversion element of the present invention having the configuration described above, a short-circuit current increases as the transmittance of the first conductive oxide layer 4 formed on the light receiving surface is high, and the short-circuit current further increases as the electric conductivities of the second conductive oxide layer 7 and the third conductive oxide layer 10 are high. As a result thereof, a fill factor (FF) in current voltage characteristics at the time of performing a photoelectric conversion is improved. Therefore, it is possible to provide a photoelectric conversion element having high conversion efficiency.

Hereinafter, each portion configuring the photoelectric conversion element of the embodiment will be described.

(Conductive Oxide Layer)

As described above, the photoelectric conversion element of the present invention includes the first conductive oxide layer 4, the second conductive oxide layer 7, and the third conductive oxide layer 10. In the photoelectric conversion element of the present invention, the first conductive oxide layer 4 functions as an antireflective film, and the second conductive oxide layer 7 and the third conductive oxide layer 10 function as electrode layers. That is, a conductive oxide configuring each layer is an oxide which transmits light and prevents reflection of the light, and also has electric conduction properties. As such an oxide, typically, an oxide such as an Indium Tin Oxide (ITO) which is able to be used as a transparent conductive film may be included.

It is necessary that the electric conductivity of the first conductive oxide layer 4 is lower than the electric conductivities of the second conductive oxide layer 7 and the third conductive oxide layer 10. Herein, as the electric conductivity of each conductive oxide layer, a value measured by a method conforming to "JIS K 7194" is adopted. For example, the electric conductivity may be measured by using a tester, a digital multimeter, or the like.

Here, it is preferable that the electric conductivities of the second conductive oxide layer 7 and the third conductive oxide layer 10 are greater than or equal to 1000 S/cm. Further, it is preferable that the electric conductivity of the second conductive oxide layer 7 is substantially identical to the electric conductivity of the third conductive oxide layer 10.

In addition, it is necessary that the transmittance of the first conductive oxide layer 4 is higher than the transmittances of the second conductive oxide layer 7 and the third conductive oxide layer 10. Here, the transmittance of each conductive oxide layer, for example, may be measured by using a spectral transmittance measurement instrument.

Here, it is preferable that the transmittance of the first conductive oxide layer 4 is greater than or equal to 90%. Further, it is preferable that the transmittance of the second conductive oxide layer 7 is substantially identical to the transmittance of the third conductive oxide layer 10.

In the photoelectric conversion element of the present invention, it is preferable that the first conductive oxide layer 4, the second conductive oxide layer 7, and the third conductive oxide layer 10 are oxides all configured of a common element. Here, "the oxides configured of a common element" indicates that a type of constituent element is in common, and in each of the conductive oxide layers, composition ratios of the respective elements in a component may be different from each other. Thus, each of the conductive oxide layers is formed of the oxide configured of the common element, and thus it is possible to use a common raw material, and it is possible to realize a photoelectric conversion element which is able to be manufactured at a low cost.

It is preferable that the common element described above is at least one element selected from a group consisting of indium (In), tin (Sn), gallium (Ga), zinc (Zn), and aluminum (Al), and as conductive oxides including these elements in common, an indium tin oxide (ITO), an indium tin oxide (IZO), an indium gallium zinc oxide (IGZO), an aluminum zinc oxide (AZO), a combination thereof, and the like may be preferably included. In addition, the component described above may be doped with a trace amount of other elements. Further, each of the conductive oxide layers may be a component layer of a single layer formed of single composition, or may be a layer in which component layers of a plurality of compositions are laminated. That is, it is preferable that the conductive oxide layer of the present invention is at least one component selected from a group consisting of an indium tin oxide, an indium zinc oxide, an indium gallium zinc oxide, and an aluminum zinc oxide.

In the photoelectric conversion element of the present invention, each of the conductive oxide layers is the oxide configured of the common element described above, and thus the electric conductivity and the transmittance of each of the conductive oxide layers may be adjusted by an oxygen content of the conductive oxide layer. That is, by adjusting oxygen contents of the second conductive oxide layer 7 and the third conductive oxide layer 10 to be lower than an oxygen content of the first conductive oxide layer 4, a relationship is obtained in which the electric conductivity of the first conductive oxide layer 4 is lower than the electric conductivities of the second conductive oxide layer 7 and the third conductive oxide layer 10, and the transmittance of the first conductive oxide layer 4 is higher than the transmittances of the second conductive oxide layer 7 and the third conductive oxide layer 10.

As a specific aspect, for example, an aspect in which the first conductive oxide layer 4, the second conductive oxide layer 7, and the third conductive oxide layer 10 are all configured of ITOs, and oxygen contents of the ITOs configuring the second conductive oxide layer 7 and the third conductive oxide layer 10 are lower than an oxygen content of the ITO configuring the first conductive oxide layer 4, and the like is able to be included.

Here, it is preferable that the oxygen content of the first conductive oxide layer 4 is greater than or equal to 33 at % and less than or equal to 50 at %, and it is preferable that the oxygen contents of the second conductive oxide layer 7 and the third conductive oxide layer 10 are less than 33 at %. In addition, it is preferable that the oxygen content of the second conductive oxide layer 7 is substantially identical to the oxygen content of the third conductive oxide layer 10. The oxygen content of each layer, for example, may be measured by a Secondary Ion Mass Spectrometry (SIMS).

A thickness of each of the conductive oxide layers, for example, may be approximately 100 nm, and it is preferable that the thickness of the second conductive oxide layer 7 is substantially identical to the thickness of the third conductive oxide layer 10.

As described above, the first conductive oxide layer 4 functions as the antireflective film. Therefore, it is preferable that the thickness of the first conductive oxide layer 4 is approximately 100 nm, and it is preferable that a refractive index is greater than or equal to 1.5 and less than or equal to 3.5.

(Semiconductor Substrate)

The semiconductor substrate 1 is not limited to a substrate formed of n-type single crystal silicon, and as the semiconductor substrate 1, a conventionally-known semiconductor substrate may be used. In addition, as the semiconductor substrate 1, for example, a semiconductor substrate in which a textured structure (not illustrated) is formed on the light receiving surface of the semiconductor substrate 1 in advance or the like may be used, and a thickness of the semiconductor substrate 1 is not particularly limited, and for example, may be greater than or equal to 100 µm and less than or equal to 300 µm, and preferably, may be greater than or equal to 100 µm and less than or equal to 200 µm. In addition, specific resistance of the semiconductor substrate 1 is not also particularly limited, and for example, may be greater than or equal to 0.1 Ω·cm and less than or equal to 1 Ω·cm.

(Non-Doped Film)

The first non-doped film 2, the second non-doped film 5, and the third non-doped film 8 are not limited to a film formed of i-type amorphous silicon, and for example, a conventionally-known i-type amorphous semiconductor film or the like may be used. A thickness of each non-doped film is not particularly limited, and for example, may be greater than or equal to 5 nm and less than or equal to 10 nm.

Here, "i-type" indicates that n-type or p-type impurities are not intentionally doped, and for example, may indicate n-type or p-type of conductivity type due to inevitable spread of the n-type or the p-type impurities or the like after preparing the photoelectric conversion element.

In addition, in the "amorphous silicon", amorphous silicon in which a dangling bond of a silicon atom is terminated with hydrogen such as amorphous silicon hydride or the like is also included.

(Amorphous Film)

The first amorphous film 3 and the second amorphous film 6 are not limited to a film formed of n-type amorphous silicon, and for example, a conventionally-known n-type amorphous semiconductor film or the like may be used. Thicknesses of the first amorphous film 3 and the second amorphous film 6 are not particularly limited, and for example, may be greater than or equal to 5 nm and less than or equal to 10 nm. Here, as n-type impurities included in the first amorphous film 3 and the second amorphous film 6, for example, phosphorus may be used, and n-type impurity concentrations of the first amorphous film 3 and the second amorphous film 6, for example, may be approximately $5 \times 10^{19}$ units/cm$^3$.

The third amorphous film 9 is not limited to a film formed of p-type amorphous silicon, and for example, a conventionally-known p-type amorphous semiconductor film or the like may be used. A thickness of the third amorphous film 9 is not particularly limited, and for example, may be greater than or equal to 5 nm and less than or equal to 10 nm. Here, as p-type impurities included in the third amorphous film 9, for example, boron may be used, and a p-type impurity concentration of the third amorphous film 9, for example, may be approximately $5 \times 10^{19}$ units/cm$^3$.

Here, from a viewpoint of suppressing curving of the photoelectric conversion element, it is preferable that a total thickness of the first non-doped film 2, the first amorphous film 3, and the first conductive oxide layer 4 which are laminated on the light receiving surface side of the semiconductor substrate 1, a total thickness of the second non-doped film 5, the second amorphous film 6, and the second conductive oxide layer 7 which are laminated on the back surface side of the semiconductor substrate 1, and a total thickness of the third non-doped film 8, the third amorphous film 9, and the third conductive oxide layer 10 are substantially the same. According to the configuration described above, in a manufacturing process of the photoelectric conversion element, the curving of the semiconductor substrate 1 is suppressed, and thus it is possible to realize a thin photoelectric conversion element compared to the related art.

Such a photoelectric conversion element of the present invention is manufactured by the following manufacturing method. In other words, the photoelectric conversion element manufactured by the following manufacturing method exhibits the properties described above. Therefore, the photoelectric conversion element of the present invention has an excellent effect in which the photoelectric conversion element has high conversion efficiency, and is able to be thinned and is able to be manufacture at a low cost.

<Method for Manufacturing Photoelectric Conversion Element>

Hereinafter, an example of a method for manufacturing a photoelectric conversion element of the embodiment will be described in detail with reference to schematic cross-sectional views of FIG. 2 to FIG. 13.

Figure 2:
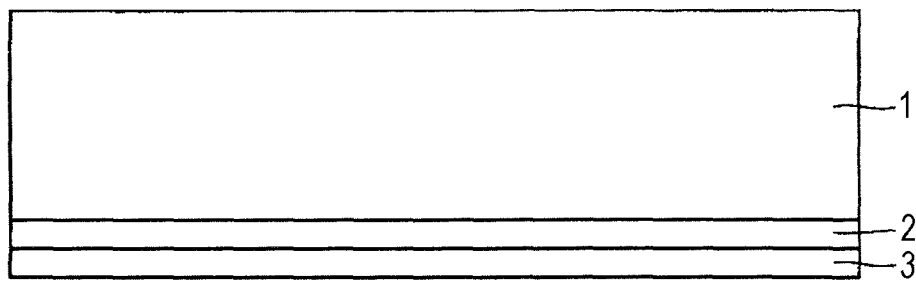
FIG. 2 is schematic cross-sectional view illustrating a part of a process of an example of a method for manufacturing the photoelectric conversion element of the embodiment.

First, as illustrated in FIG. 2, the first non-doped film 2 formed of i-type amorphous silicon and the first amorphous film 3 formed of n-type amorphous silicon are laminated in this order on the entire light receiving surface of the n-type semiconductor substrate 1, for example, by a plasma Chemical Vapor Deposition (CVD) method.

Figure 3:
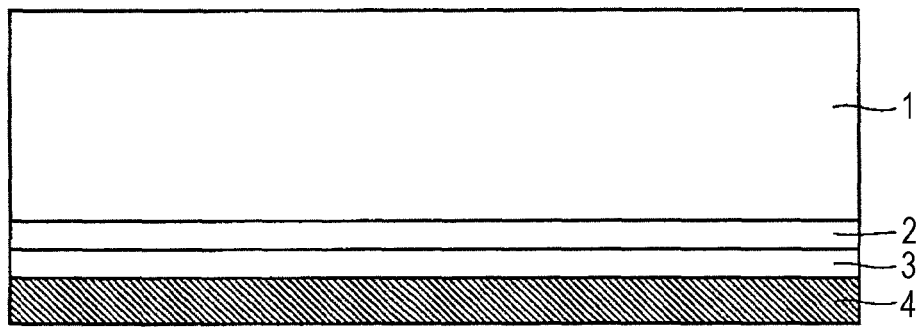
FIG. 3 is a schematic cross-sectional view illustrating a part of a process of an example of the method for manufacturing the photoelectric conversion element of the embodiment.

Next, as illustrated in FIG. 3, the first conductive oxide layer 4 which is formed of oxygen and at least one element selected from a group consisting of indium (In), tin (Sn), gallium (Ga), zinc (Zn), and aluminum (Al) is formed on the entire surface of the first amorphous film 3 by a sputtering method.

Here, as the sputtering method, a conventionally-known method may be adopted, and for example, a direct current glow discharge sputtering method, a high frequency sputtering method, a magnetron sputtering method, a balanced magnetron sputtering method, an unbalanced magnetron sputtering method, a dual magnetron sputtering method, an ion beam type sputtering method, an arc type ion plating method, and the like may be included.

In addition, it is preferable that an introduced oxygen flow ratio at the time of forming the first conductive oxide layer by the sputtering method is greater than or equal to 5%.

Figure 4:
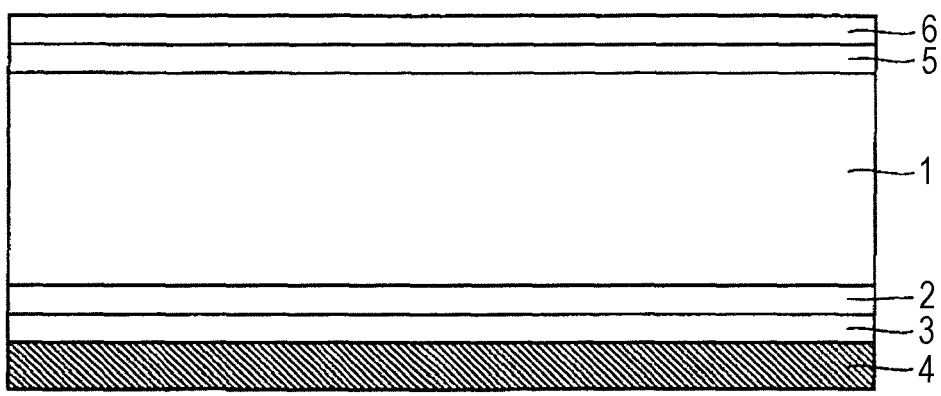
FIG. 4 is a schematic cross-sectional view illustrating a part of a process of an example of the method for manufacturing the photoelectric conversion element of the embodiment.

Next, as illustrated in FIG. 4, the second non-doped film 5 formed of i-type amorphous silicon and the second amorphous film 6 formed of n-type amorphous silicon are laminated in this order on the entire back surface of the semiconductor substrate 1, for example, by a plasma CVD method.

Figure 5:
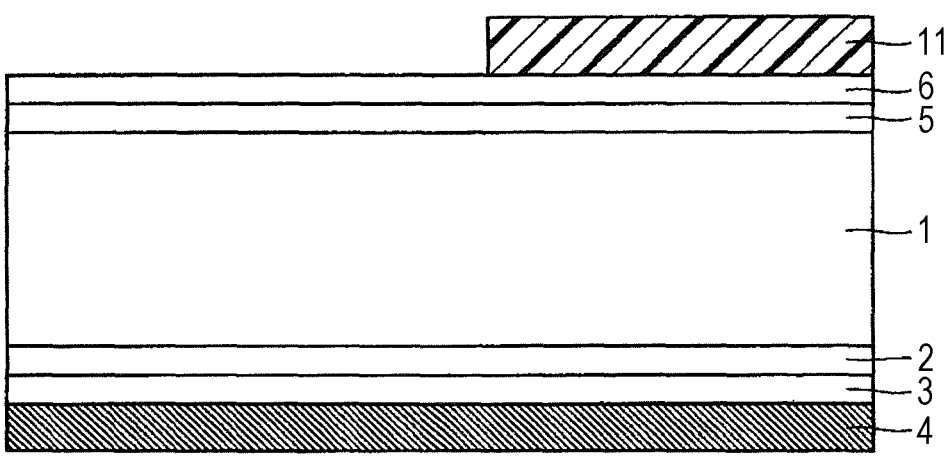
FIG. 5 is a schematic cross-sectional view illustrating a part of a process of an example of the method for manufacturing the photoelectric conversion element of the embodiment.

Next, as illustrated in FIG. 5, a resist film 11 is formed on a part of the second amorphous film 6. Here, the resist film 11 is not particularly limited, and for example, a film formed by printing resist ink using an ink jet method, and by drying the resist ink, or the like may be used.

Figure 6:
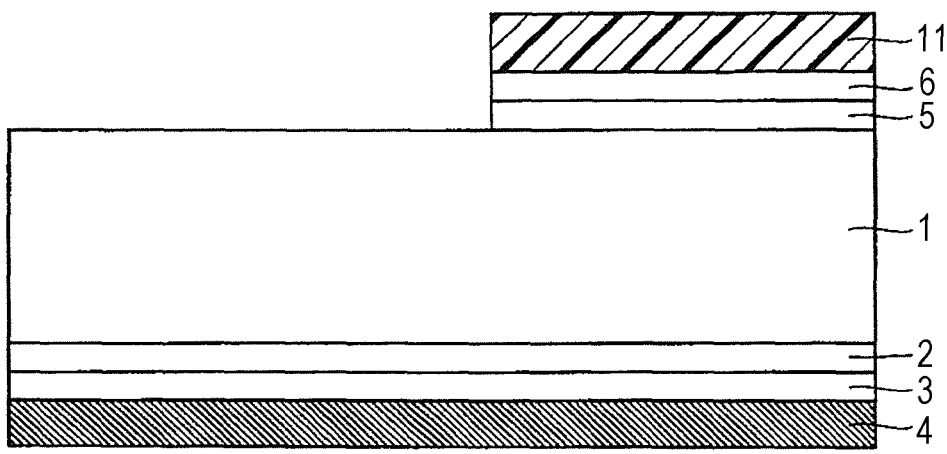
FIG. 6 is a schematic cross-sectional view illustrating a part of a process of an example of the method for manufacturing the photoelectric conversion element of the embodiment.

Next, as illustrated in FIG. 6, a part of the second non-doped film 5 and a part of the second amorphous film 6 which are not covered with the resist film 11 are removed, and the semiconductor substrate 1 is exposed. Here, a method of removing the second non-doped film 5 and the second amorphous film 6 is not particularly limited, and dry etching is preferably used.

Figure 7:
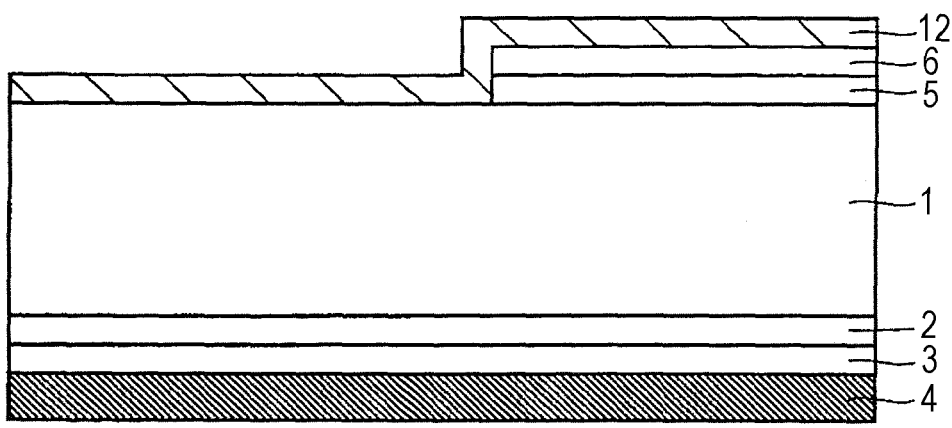
FIG. 7 is a schematic cross-sectional view illustrating a part of a process of an example of the method for manufacturing the photoelectric conversion element of the embodiment.

Next, the resist film 11 is removed and cleaned, and then, as illustrated in FIG. 7, a metal film 12 is formed on an exposed surface of the semiconductor substrate 1 and on the second amorphous film 6, for example, by a sputtering method. Here, the metal film 12 is not particularly limited, and for example, aluminum or the like may be used.

Figure 8:
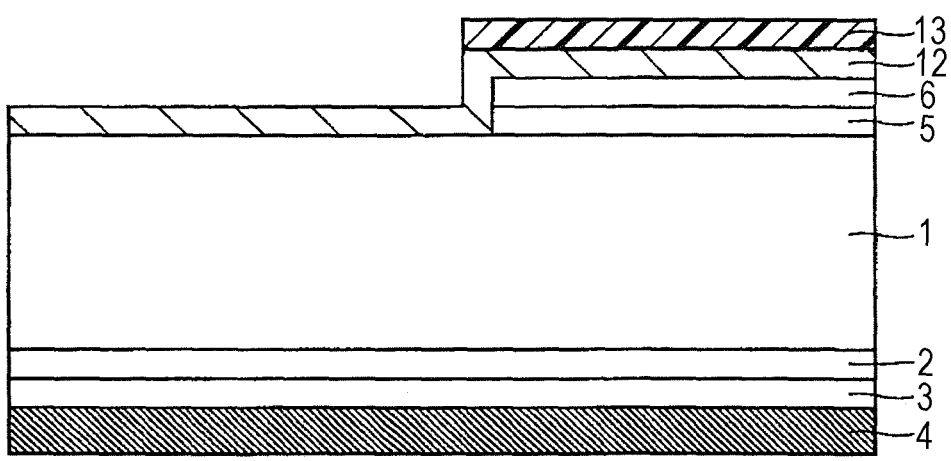
FIG. 8 is a schematic cross-sectional view illustrating a part of a process of an example of the method for manufacturing the photoelectric conversion element of the embodiment.

Next, as illustrated in FIG. 8, an acid-tolerant resist film 13 is formed on a part of the metal film 12. Here, the acid-tolerant resist film 13 is not particularly limited, and a conventionally-known film may be used.

Figure 9:
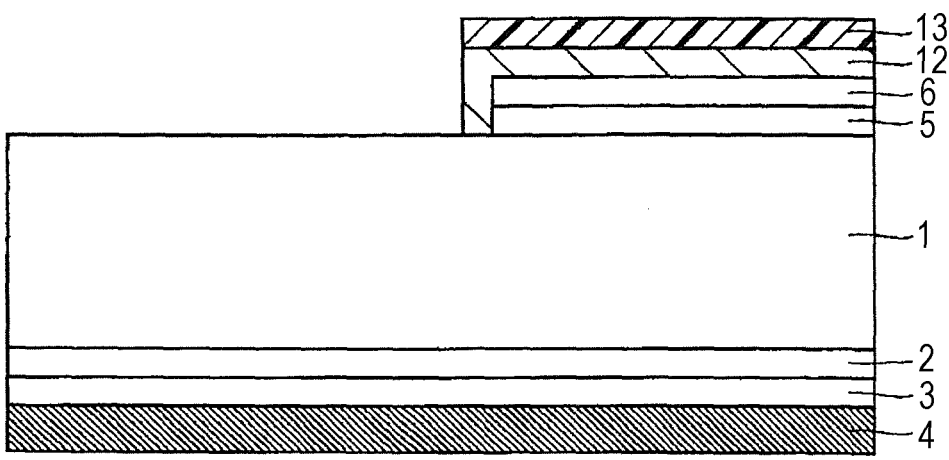
FIG. 9 is a schematic cross-sectional view illustrating a part of a process of an example of the method for manufacturing the photoelectric conversion element of the embodiment.

Next, as illustrated in FIG. 9, by removing a part of the metal film 12 which is exposed from the resist film 13, the semiconductor substrate 1 is exposed. Here, as a method of removing the metal film 12, wet etching using an acidic solution is preferably used. Here, as the acidic solution, for example, a hydrochloric acid, a nitric acid, a hydrofluoric acid, a combination thereof, and the like may be used.

Figure 10:
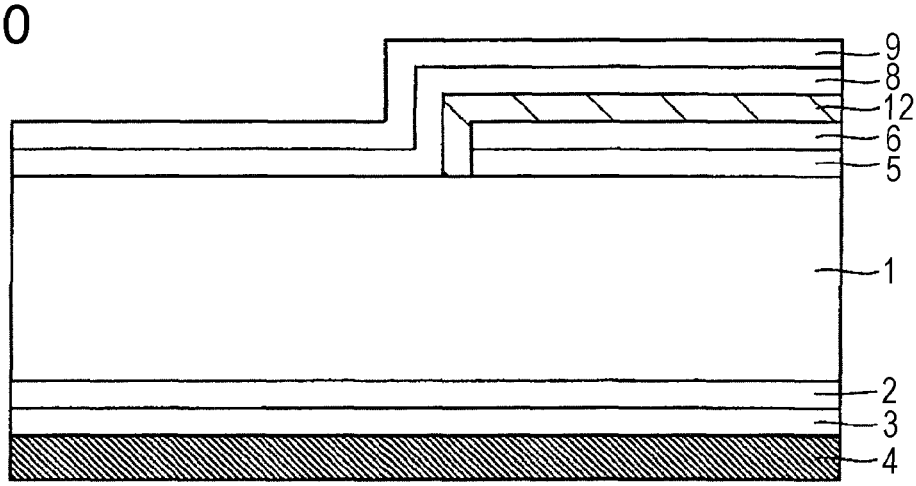
FIG. 10 is a schematic cross-sectional view illustrating a part of a process of an example of the method for manufacturing the photoelectric conversion element of the embodiment.

Next, the resist film 13 is removed and cleaned, and then, as illustrated in FIG. 10, the third non-doped film 8 formed of i-type amorphous silicon and the third amorphous film 9 formed of p-type amorphous silicon are laminated in this order on the exposed surface of the semiconductor substrate 1 and on the second amorphous film 6, for example, by a plasma CVD method.

Figure 11:
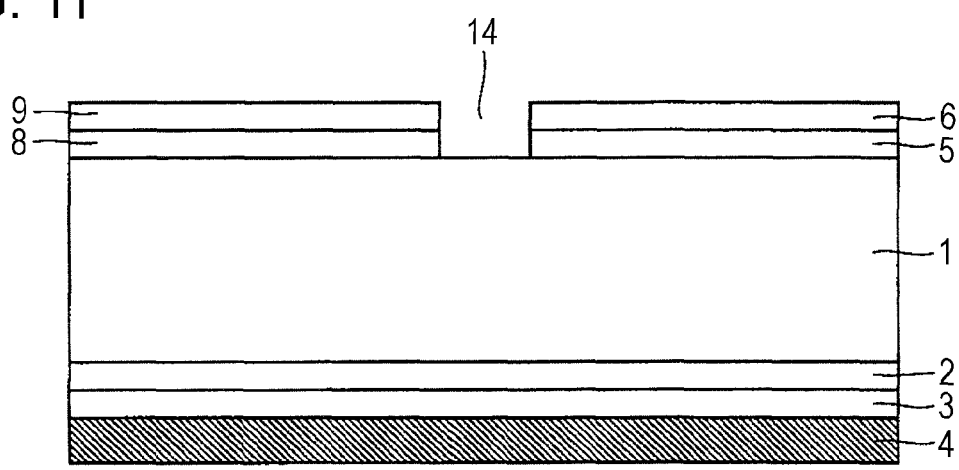
FIG. 11 is a schematic cross-sectional view illustrating a part of a process of an example of the method for manufacturing the photoelectric conversion element of the embodiment.

Next, as illustrated in FIG. 11, a remaining portion of the metal film 12 is removed by wet etching using an acidic solution, and the third non-doped film 8 and the third amorphous film 9 which have been formed on the remaining portion of the metal film 12 are removed by a liftoff method.

Figure 12:
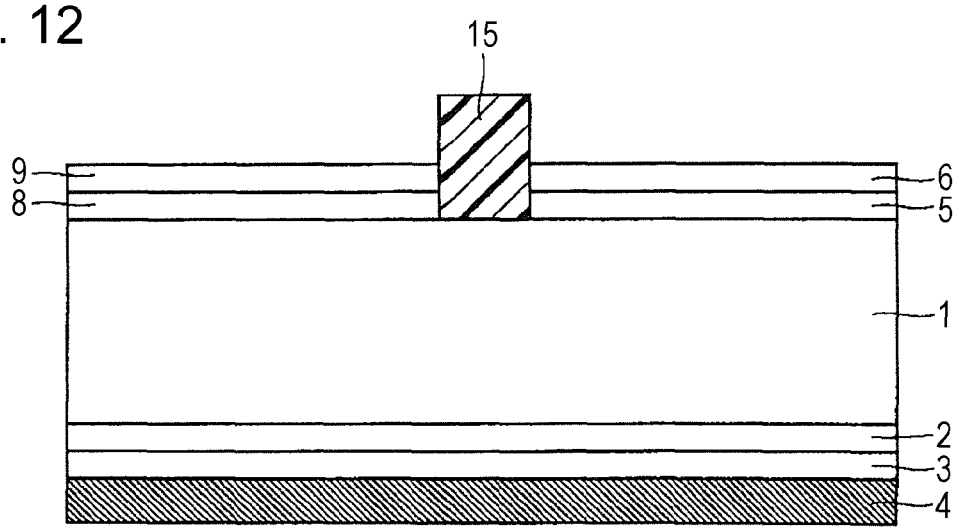
FIG. 12 is a schematic cross-sectional view illustrating a part of a process of an example of the method for manufacturing the photoelectric conversion element of the embodiment.

Next, as illustrated in FIG. 12, a resist film of a mask material 15 is formed in the vicinity of an opening portion 14 between the second amorphous film 6 and the third amorphous film 9.

Here, the mask material 15 is not particularly limited, and a photoresist is preferably used.

Figure 13:
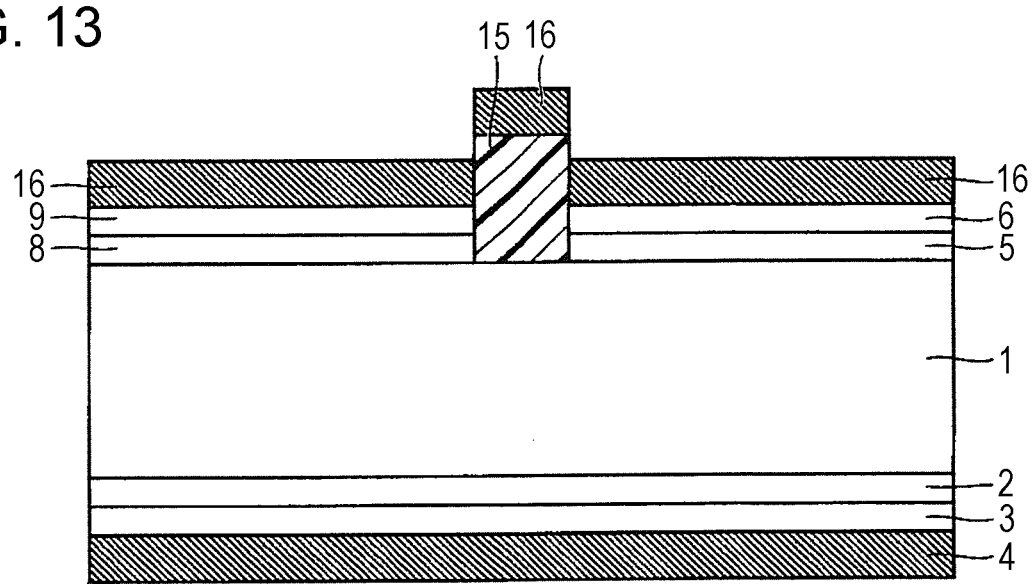
FIG. 13 is a schematic cross-sectional view illustrating a part of a process of an example of the method for manufacturing the photoelectric conversion element of the embodiment.

Next, as illustrated in FIG. 13, a conductive oxide layer 16 which is formed of oxygen and the common element with the first conductive oxide layer 4 is formed on the second amorphous film 6, on the third amorphous film 9, and on the mask material 15 by a sputtering method.

Here, an introduced oxygen flow ratio at the time of forming the conductive oxide layer 16 by a sputtering method (a ratio of an introduced oxygen flow rate to a total introduced gas flow rate including inert gas such as argon gas) is preferably lower than an introduced oxygen flow ratio at the time of forming the first conductive oxide layer, and more preferably, is less than 5%. When the introduced oxygen flow ratio is greater than or equal to 5%, the mask material 15 is easily damaged due to an oxygen radical in a chamber, and thus the shape of the mask material 15 is changed. When the shape of the mask material 15 is changed, the second conductive oxide layer 7 is not sufficiently separated from the third conductive oxide layer 10 at the time of removing a part of the mask material 15 and a part of the conductive oxide layer 16 by a liftoff method described later, and thus a short circuit may occur. When the introduced oxygen flow ratio is less than 5%, it is possible to suppress plasma damage to the extent of being substantially neglected, and thus it is possible to prevent a short circuit.

Next, as illustrated in FIG. 1, the mask material 15 and the conductive oxide layer 16 formed on the mask material 15 are removed by a liftoff method, and thus the conductive oxide layer 16 is separated into the second conductive oxide layer 7 and the third conductive oxide layer 10. Accordingly, an n-type electrode (the second conductive oxide layer 7) and a p-type electrode (the third conductive oxide layer 10) are able to be simply and reliably separated from each other.

In the method for manufacturing a photoelectric conversion element of the present invention including the above described processes, it is possible to use a common target material in each process of forming the first conductive oxide layer 4, the second conductive oxide layer 7, and the third conductive oxide layer 10 by a sputtering method, and thus it is possible to manufacture the photoelectric conversion element of the present invention at a low cost. In addition, in the process of forming the second conductive oxide layer 7 and the third conductive oxide layer 10 by a sputtering method, the plasma damage of the mask material 15 is reduced by restricting the introduced oxygen flow ratio to be low. Accordingly, when liftoff is performed with respect to the mask material 15, there is no short circuit between the electrodes.

In addition, at the same time, the introduced oxygen flow ratio at the time of forming the second conductive oxide layer 7 and the third conductive oxide layer 10 is restricted to be lower than the introduced oxygen flow ratio at the time of forming the first conductive oxide layer 4, and thus a configuration in which the electric conductivity of the first conductive oxide layer 4 is lower than the electric conductivities of the second conductive oxide layer 7 and the third conductive oxide layer 10, and the transmittance of the first conductive oxide layer 4 is higher than the transmittances of the second conductive oxide layer 7 and the third conductive oxide layer 10 may be obtained. As described above, in the photoelectric conversion element of the present invention, a short-circuit current increases and high conversion efficiency is exhibited according to the configuration described above.

It should be considered that the embodiment disclosed herein is an example in all respects, and is not limited. It is intended that the scope of the present invention is indicated by Claims, but not by the above description, and includes all changes in the meaning and the range equivalent to Claims.

INDUSTRIAL APPLICABILITY

The present invention may be used in a photoelectric conversion element and a method for manufacturing a photoelectric conversion element.

REFERENCE SIGNS LIST

1 SEMICONDUCTOR SUBSTRATE
2 FIRST NON-DOPED FILM
3 FIRST AMORPHOUS FILM
4 FIRST CONDUCTIVE OXIDE LAYER
5 SECOND NON-DOPED FILM
6 SECOND AMORPHOUS FILM
7 SECOND CONDUCTIVE OXIDE LAYER
8 THIRD NON-DOPED FILM
9 THIRD AMORPHOUS FILM
10 THIRD CONDUCTIVE OXIDE LAYER
11 RESIST FILM
12 METAL FILM
13 ACID-TOLERANT RESIST FILM
14 OPENING PORTION
15 MASK MATERIAL
16 CONDUCTIVE OXIDE LAYER

The invention claimed is:

1. A photoelectric conversion element, comprising:
a semiconductor substrate of a first conductivity type;
a first amorphous film of the first conductivity type disposed on an entire surface of one surface of the semiconductor substrate;
a first conductive oxide layer disposed on the first amorphous film;
a second amorphous film of the first conductivity type disposed on a part of the other surface of the semiconductor substrate;
a second conductive oxide layer disposed on the second amorphous film;
a third amorphous film of a second conductivity type disposed on the other part of the other surface of the semiconductor substrate; and
a third conductive oxide layer disposed on the third amorphous film,
wherein electric conductivity of the first conductive oxide layer is lower than electric conductivities of the second conductive oxide layer and the third conductive oxide layer, wherein transmittance of the first conductive oxide layer is higher than transmittances of the second conductive oxide layer and the third conductive oxide layer, wherein the first conductive oxide layer, the second conductive oxide layer, and the third conductive oxide layer are oxides configured of a common element, and wherein oxygen contents of the second conductive oxide layer and the third conductive oxide layer are lower than an oxygen content of the first conductive oxide layer.

2. The photoelectric conversion element according to claim 1, wherein the common element is at least one element selected from a group consisting of indium, tin, gallium, zinc, and aluminum.

3. The photoelectric conversion element according to claim 1, wherein the oxygen content of the first conductive oxide layer is greater than or equal to 33 at % and less than or equal to 50 at %, and the oxygen contents of the second conductive oxide layer and the third conductive oxide layer are less than 33 at %.

4. A method for manufacturing a photoelectric conversion element, comprising:

a step of forming a first amorphous film of a first conductivity type on an entire surface of one surface of a semiconductor substrate of the first conductivity type;

a step of forming a first conductive oxide layer on the first amorphous film by a sputtering method;

a step of forming a second amorphous film of the first conductivity type on the other surface of the semiconductor substrate;

a step of forming a third amorphous film of a second conductivity type on the other surface to be separated from the second amorphous film;

a step of forming a mask material between the second amorphous film and the third amorphous film;

a step of forming a conductive oxide layer for preparing a second conductive oxide layer and a third conductive oxide layer by a sputtering method on the second amorphous film, on the third amorphous film, and on the mask material; and a step of separating the conductive oxide layer for preparing the second conductive oxide layer and the third conductive oxide layer into the second conductive oxide layer and the third conductive oxide layer by removing the mask material, wherein an introduced oxygen flow ratio in the step of forming the first conductive oxide layer by the sputtering method is higher than an introduced oxygen flow ratio in the step of forming the conductive oxide layer for preparing the second conductive oxide layer and the third conductive oxide layer by the sputtering method.

* * * * *